United States Patent [19]
Gay

[11] Patent Number: 5,677,951
[45] Date of Patent: Oct. 14, 1997

[54] ADAPTIVE FILTER AND METHOD FOR IMPLEMENTING ECHO CANCELLATION

[75] Inventor: Steven Leslie Gay, Long Valley, N.J.

[73] Assignee: Lucent Technologies Inc., Murray Hill, N.J.

[21] Appl. No.: 492,469

[22] Filed: Jun. 19, 1995

[51] Int. Cl.$^6$ .............................. H04M 9/00; H04J 1/00; G06F 15/31

[52] U.S. Cl. ................ 379/406; 379/410; 379/411; 364/724.19; 370/32.1

[58] Field of Search ......................... 379/406, 410, 379/411, 409; 370/32.1; 364/724.19

[56] References Cited

U.S. PATENT DOCUMENTS

| | | | |
|---|---|---|---|
| 4,817,081 | 3/1989 | Wouda et al. | 370/321 |
| 5,153,875 | 10/1992 | Takatori | 370/32.1 |
| 5,216,629 | 6/1993 | Gurcan et al. | 364/724.19 |
| 5,285,480 | 2/1994 | Chennakeshu et al. | 375/101 |
| 5,293,402 | 3/1994 | Crespo et al. | 375/14 |
| 5,303,264 | 4/1994 | Ohsawa | 375/12 |
| 5,327,495 | 7/1994 | Shenoi et al. | 379/410 |
| 5,351,291 | 9/1994 | Menez et al. | 379/410 |
| 5,353,348 | 10/1994 | Sendyk et al. | 379/410 |
| 5,359,656 | 10/1994 | Kim | 379/410 |
| 5,371,789 | 12/1994 | Hirano | 379/410 |
| 5,408,530 | 4/1995 | Makino et al. | 379/390 |
| 5,428,562 | 6/1995 | Gay | 364/724.19 |

OTHER PUBLICATIONS

European Patent Application No. 0 617 521 A2.
European Search Report No. EP 96 30 4329.
PCT International Application No. WO 95/06986.

B. Toplis et al., "Tracking Improvements in Fast RLS Algorithms Using a Variable Forgetting Factor", IEEE Transactions on Acoustics, Speech, and Signal Processing; vol. 36, No. 2, Feb. 1988, pp. 206–227.

G. Carayannis et al., "A Fast Sequential Algorithm for Least Squares Filtering and Prediction", IEEE Transactions on Acoustics, Speech, and Signal Processing, vol. ASSP-31, No. 6, 1983, pp. 1394–1402.

J.M. Cioffi et al., "Fast Recursive Least Squares Transversal Filters for Adaptive Processing", IEEE Transactions on Acoustics, Speech, and Signal Processing, vol. ASSP-34, 1984, pp. 304–337.

D.T.M. Slock et al., "A Modular Multichannel Multiexperiment Fast Transversal Filter RLS Algorithm", Signal Processing, Elsevier Science Publishers, vol. 28, 1992, pp. 25–44.

D.T.M. Slock et al., "Numerically Stable Fast Transversal Filters for Recursive Least Squares Adaptive Filtering", IEEE Transactions on Signal Processing, vol. 39, No. 1, Jan. 1991, pp. 92–114.

*Primary Examiner*—Krista M. Zele
*Assistant Examiner*—Jacques M. Saint-Surin

[57] ABSTRACT

A dynamically regularized fast recursive least squares (DR-FRLS) adaptive filter and method are disclosed which provide O(N) computational complexity and which have dynamically adjusted regularization in real-time without requiring restarting the adaptive filtering. The adaptive filter includes a memory for storing at least one program, including a dynamically regularized fast recursive least squares (DR-FRLS) program; and a processor which responds to the DR-FRLS program for adaptively filtering an input signal and for generating an output signal associated with the input signal.

17 Claims, 3 Drawing Sheets

ADAPTIVE FILTER AND METHOD FOR IMPLEMENTING ECHO CANCELLATION

BACKGROUND OF THE INVENTION

1. Field of the Invention

The invention relates to adaptive filtering techniques, and, more particularly, to an adaptive filtering technique applicable to acoustic echo cancellation.

2. Description of the Related Art

Adaptive filtering techniques may be applied, for example, to acoustic echo cancellation, speech processing and video processing, including video compression. In particular, fast recursive least squares (FRLS) techniques are known which have relatively fast convergence even as when the input excitation signal is highly colored or self-correlated, while also having relatively low computational complexity. FRLS techniques, as well as recursive least squares (RLS) techniques, generally employ the inverse of the sample covariance matrix $R_n$ of the input excitation signal, which may cause the FRLS and RLS techniques to be computationally unstable when $R_n$ is poorly conditioned; i.e. when the condition number of $R_n$ (i.e. the ratio of the highest eigenvalue of $R_n$ to its lowest eigenvalue) is high.

Such high condition numbers may occur due to self-correlation of the excitation signal, or due to the use of a relatively short data window for the estimation of $R_n$. RLS and FRLS are susceptible to system measurement noise and/or numerical errors from finite precision computations when $R_n$ has some relatively small eigenvalues.

One method for countering such instability is to implement a regularization technique to least square methods such as FRLS and RLS. In regularization, a matrix such as $\delta I_N$ is added to $R_n$ prior to inversion, where $\delta$ is a relatively small positive number, and $I_N$ is the N dimensional identity matrix. The use of matrix $\delta I_N$ establishes $\delta$ as a lower bound for the minimum eigenvalue of the resulting matrix $R_n + \delta I_N$, and thus stabilizing the least squares solution, depending on the size of $\delta$.

Generally, for FRLS adaptive filtering, regularization may increase the computational complexity of the FRLS technique beyond O(N) complexity. In addition, although FRLS may perform adaptive filtering, its initial degree of regularization diminishes with time and may not be restored except by restarting the adaptive filtering.

SUMMARY

A dynamically regularized FRLS (DR-FRLS) adaptive filter and method are disclosed which provide O(N) computational complexity and which have dynamically adjusted regularization in real-time without requiring restarting the adaptive filtering. The adaptive filter includes a memory for storing at least one program, including a dynamically regularized fast recursive least squares (DR-FRLS) program; and a processor which responds to the DR-FRLS program for adaptively filtering an input signal and for generating an output signal associated with the input signal.

BRIEF DESCRIPTION OF THE DRAWINGS

The features of the disclosed adaptive filter and method will become more readily apparent and may be better understood by referring to the following detailed description of an illustrative embodiment of the present invention, taken in conjunction with the accompanying drawings, where.

DETAILED DESCRIPTION

Figure 1:
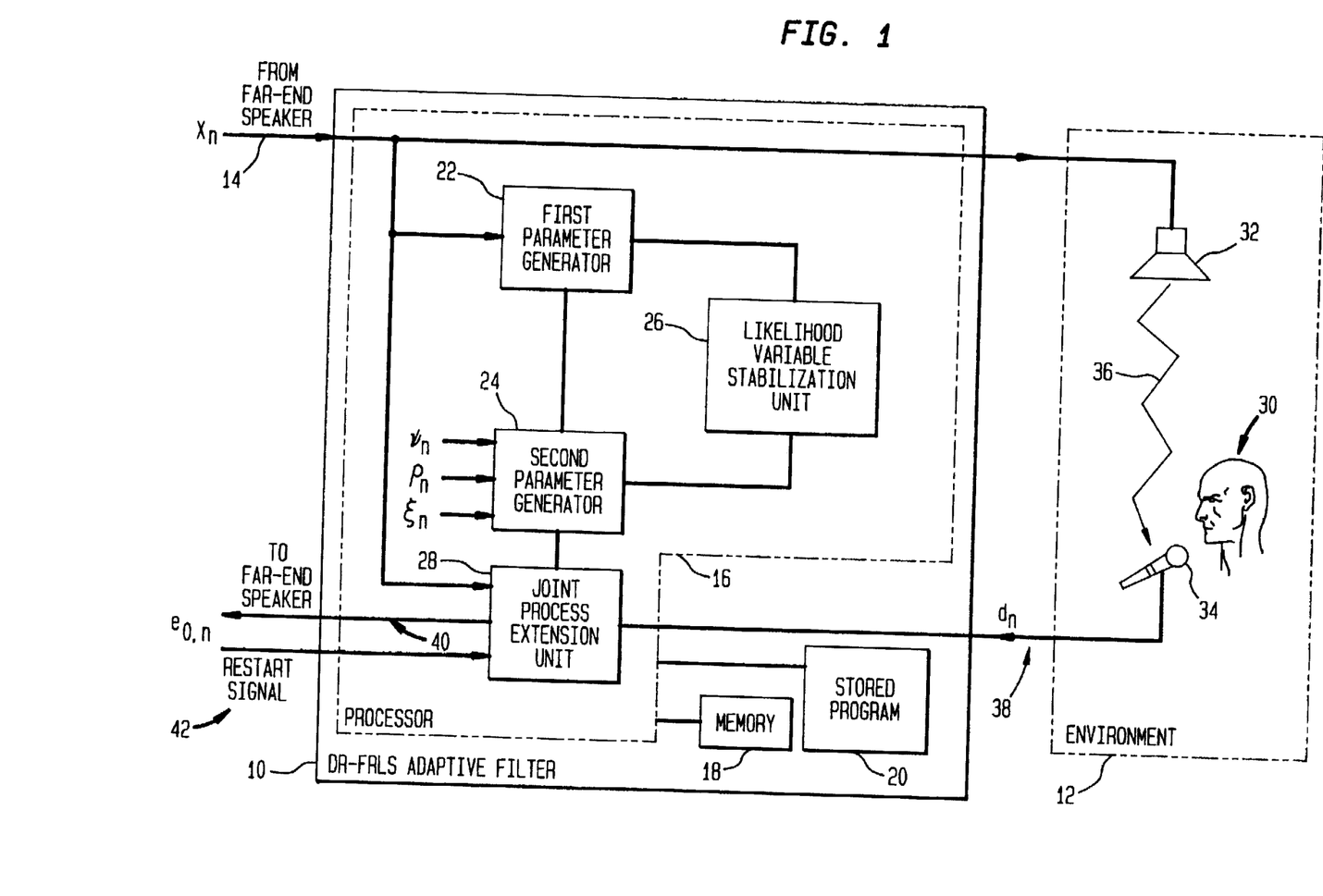
FIG. 1 illustrates a block diagram of the disclosed adaptive filter.

Referring now in specific detail to the drawings, with like reference numerals identifying similar or identical elements, as shown in FIG. 1, the present disclosure describes an adaptive filter 10 and method which may be, in an exemplary embodiment, applicable for acoustic echo cancellation in an environment 12. The disclosed adaptive filter 10 and method implements a DR-FRLS adaptive filtering technique which provides O(N) computational complexity and which has dynamically adjusted regularization in real-time without restarting the adaptive filtering.

As described in greater detail below, the disclosed adaptive filter 10 and method are described with reference to acoustic echo cancellation as an exemplary embodiment, and various terms and notations are employed with respect to echo cancellation. One skilled in the art may implement the disclosed adaptive filter 10 and method to other applications such as speech processing and video processing, including video compression.

Referring to FIG. 1, the disclosed adaptive filter 10 and method receives an input excitation signal 14 labelled $x_n$ from a far-end speaker (not shown in FIG. 1), where n is a sample index, and $x_n$ is equal to 0 for n<0. In an exemplary embodiment, the disclosed adaptive filter 10 includes a processor 16, memory 18, and at least one stored program 20, including a DR-FRLS program as described herein, for processing the excitation signal 14. The processor 16 includes a first parameter generator 22, a second parameter generator 24, a likelihood variable stabilization unit 26, and a joint process extension unit 28, as described in greater detail below. The second parameter generator 24 also receives a refresh signal corresponding to $\psi_n$, $\xi_n$, and $p_n$ as described, for example, in reference to Equations (11)–(13) below, which may be generated by the processor 16, or may be received from an input device (not shown in FIG. 1), and then stored in memory 18 of the adaptive filter 10. Such components 22–28 of processor 16 may be individual processors or portions of at least one processor, such as a microprocessor and/or an integrated circuit, operating in conjunction with the memory 18 and stored program 20 as described herein.

The excitation signal 14 is also provided to the environment 12, which may be a near-end region such as a room having near-end or local speech and noise associated with a talker 30. The room also includes a loudspeaker 32, a microphone 34, and an echo path 36 therebetween. The loudspeaker 32 responds to the excitation signal 14 to generate audio signals, which may also generate echoes associated with the echo path 36.

The microphone 34 receives the audio signals from the environment 12, including the noise and echoes, and generates a desired signal 38 labelled $d_n$. The desired signal $d_n$ includes the room or environment response; i.e. the echo, caused by the excitation signal $x_n$, as well as any background acoustic signal $v_n$ detected by the microphone 34.

The disclosed adaptive filter 10 and method processes the desired signal $d_n$, as described in greater detail below, to generate an echo residual signal 40, labelled $e_{o,n}$, which is output to the far-end speaker (not shown in FIG. 1). The echo residual signal 40 corresponds to an a priori error or residual echo associated with the excitation signal $x_n$. The echo residual signal 40 may then be used by the far-end speaker and appropriate devices known in the art to compensate for the echo caused by the excitation signal $x_n$ in environment 12.

The disclosed adaptive filter 10 and method of use, including the components 22–28, may be implemented in hardware such as firmware or customized integrated circuits controlled by a controller operating to perform the disclosed method of use of the disclosed adaptive filter 10. In particular, the controller (not shown in FIG. 1) may provide a restart signal 42 to, for example, the joint process extension unit 28 of the disclosed adaptive filter 10 and method, as discussed in greater detail below. The restart signal 42 may be generated by the user through an input device (not shown in FIG. 1).

The disclosed adaptive filter 10 and method of use may also be implemented in an integrated circuit or a computer. For example, the disclosed adaptive filter 10 and method may be implemented on an INDY workstation, available from SILICON GRAPHICS, employing a R4000-based microprocessor as processor 16, having about 8 MB of memory as memory 18, and running compiled or interpreted source code written in a high level language such as MAT-LAB® as the at least one stored program 20, where MAT-LAB® is available from THE MATHWORKS, INC. of Natick, Mass.

In the disclosed adaptive filter 10 and method, FRLS is modified to include a computationally efficient regularization technique. Generally, RLS and FRLS are efficient implementations of the following equations:

$$e_{0,n} = d_n - \vec{X}_n^T \vec{h}_{n-1} \qquad (1)$$

$$\vec{h}_n = \vec{h}_{n-1} + R_n^{-1} \vec{X}_n e_{0,n} \qquad (2)$$

where $$\vec{X}_n = [X_n, X_{n-1}, \ldots, X_{n-N-1}]^T \qquad (3)$$

is an N-length excitation vector;

$$\vec{h}_n = [h_{1,n}, h_{2,n}, \ldots, h_{N,n}]^T \qquad (4)$$

is an N-length adaptive filter coefficient vector; and $R_n$ is the N×N sample covariance matrix of $x_n$.

In RLS and FRLS, windowing techniques may be applied to the data used to estimate $R_n$. For example, an exponential window may be used to provide rank-one updating of $R_n$ from sample period n-1 to sample period n according to:

$$R_n = \lambda^{n+1} \delta_0 D_\lambda + \sum_{i=0}^{n} \lambda^i \vec{x}_{n-i} \vec{x}_{n-i}^T \qquad (5)$$

$$= \lambda R_{n-1} + \vec{x}_n \vec{x}_n^T \qquad (6)$$

where $\lambda$ is a forgetting factor having a value such that $0 < \lambda \leq 1$;

$$D_\lambda = \text{diag}\{\lambda^{N-1}, \lambda^{N-2}, \ldots, \lambda, 1\} \qquad (7)$$

and $$R_{-1} = \delta_0 D_\lambda. \qquad (8)$$

Exploitation of the rank-one update of $R_n$ of Equation (6) was what led to $O(N^2)$ complexity RLS from $O(N^3)$ complexity least squares methods, and further exploitation of the shift invariant nature of $\vec{x}_n$ led to $O(N)$ complexity FRLS methods from RLS.

With $R_n$ as above in Equations (5)–(8), $\delta_0 D_\lambda$ is used to initially regularize the inverse of Equation (2), but it may be seen that, according to the first term on the right side of Equation (5), the effect of $\delta_0 D_\lambda$ diminishes with time. Adding an appropriately scaled version of $\delta I_N$ to $R_n$ prior to inversion in Equation (2) in each sample period would regularize the inverse, but that would require an additional rank-N update at each sample period, which would eliminate the computational benefit of the rank-one update in Equation (6) above.

One alterative method is to add to $R_n$ a regularization matrix $D_n$ which is an approximation of $\delta I_N$, in which $D_n$ is updated at each sample period with a rank-one update matrix obtained from the outer product of a shift invariant vector; that is, Equation (2) above is modified to be:

$$\vec{h}_n = \vec{h}_{n-1} + R_{x,n}^{-1} \vec{x}_n e_{0,n} \qquad (9)$$

where $$R_{x,n} = D_n + R_n. \qquad (10)$$

With both $D_n$ and $R_n$ being maintained by rank-one updates, $R_{X,n}$ then requires a rank-two update, which only moderately increases the computational complexity.

$D_n$ may be generated recursively using the outer product of a vector composed of a shift invariant signal such that the eigenvalues of $D_n$ are updated or refreshed as often as possible. Accordingly, let the vector:

$$\vec{p}_n = [0, 0, \ldots, 0, 1, 0, \ldots, 0]^T \qquad (11)$$

have all elements equal to zero except for a value of 1 in position $1 + [n]_{mod\ N}$. A regularization matrix update may then be performed according to:

$$D_n = \sum_{i=0}^{n} \lambda^i \psi_n \xi_n^2 \vec{p}_{n-i} \vec{p}_{n-i}^T \qquad (12)$$

$$= \lambda D_{n-1} + \psi_n \xi_n^2 \vec{p}_n \vec{p}_n^T \qquad (13)$$

with $D_{-1} = 0$ as an initial condition. In Equations (12)–(13), $\psi_n$ may have the values of +1 or −1. The sample periods in which $\psi_n$ and $\xi_n$ may change values are restricted to those sample periods where the $\vec{p}_n$ vector has its only non-zero value in the first position thereof. This restriction causes $\psi_n \xi_n \vec{p}_n$ to be shift invariant, which is a property that is exploited for efficient computation as, for example, in the FRLS technique.

The $\psi_n$ and $\xi_n$ signals control the size of the regularization of the disclosed adaptive filter 10 and method, where $\psi_n$ determines whether $\xi_n^2$ inflates or deflates the regularization matrix $D_n$. If $\psi_n$ and $\xi_n$ are fixed, then the $i^{TH}$ diagonal element of $D_n$ attains a steady state value of:

$$d_{i,n} = \psi_n \xi_n^2 \frac{\lambda^{[n-i+1]mod\ N}}{1 - \lambda^N} \qquad (14)$$

which indicates that the regularization provided by the $i^{TH}$ diagonal element of $D_n$ varies periodically due to the periodic nature of the regularization update. For example, the variation may be depicted as a saw-tooth pattern with a degree of variance ranging from $\lambda^{N-1}$ to 1. Preferably, the parameter $\lambda$ is to be chosen to have a value near 1 to obtain a relatively steady amount of regularization.

Updating $D_n$ may also be performed with a rank-two update with a second dyadic product producing a regularization update which is 180 degrees out of phase with the first dyadic product, resulting in a decrease in the variation in the $d_{i,n}$ values.

The disclosed adaptive filter 10 and method implements a DR-FRLS adaptive filtering technique to operate as a dynamically regularized fast transversal filter (FTF) with computational stability, where the rank-two updating of $R_{x,n}$ in Equation (10) may be implemented as two rank-one updates. An intermediate regularization refreshed covariance matrix $R_{p,n}$ is defined as:

$$R_{p,n} = \lambda R_{x,n-1} + \psi_n \xi_n^2 \vec{P}_n \vec{P}_n^T \tag{15}$$

and the data updated covariance matrix is defined as:

$$R_{x,n} = R_{p,n} + \vec{X}_n \vec{X}_n^T. \tag{16}$$

From the matrix inversion lemma:

$$(A+BC)^{-1} = A^{-1} - A^{-1}B(1+CA^{-1}B)^{-1}CA^{-1} \tag{17}$$

and using Equation (16), a data a posteriori Kalman gain vector may be expressed as:

$$\begin{aligned}\vec{k}_{1,x} &= R_{x,n}^{-1}\vec{x}_n \\ &= (R_{p,n}^{-1} - R_{p,n}^{-1}\vec{x}_n(1+\vec{x}_n^T R_{p,n}^{-1}\vec{x}_n)^{-1}\vec{x}_n^T R_{p,n}^{-1})\vec{x}_n\end{aligned} \tag{18}$$

A data a priori Kalman gain vector may then be defined as:

$$\vec{k}_{0,x,n} = R_{p,n}^{-1}\vec{x}_n \tag{19}$$

and a data likelihood variable may be defined as:

$$\mu_{x,n} = (1+\vec{k}_{0,x,n}^T \vec{x}_n)^{-1} \tag{20}$$

Equation (18) may be rewritten as:

$$\vec{k}_{1,x} = R_{x,n}^{-1}\vec{x}_n = \vec{k}_{0,x,n}\mu_{x,n} \tag{21}$$

and, using Equation (21) in Equation (9), the coefficient update becomes:

$$\vec{h}_n = \vec{h}_{n-1} + \vec{k}_{0,x,n}\mu_{x,n}e_{0,n} \tag{22}$$

The stable computation of the parameters $\vec{k}_{0,x,n}$ and $\mu_{x,n}$ from sample period to sample period are disclosed in greater detail below. The computation of various parameters for a current sample period is performed recursively from the parameters of a previous sample period. For example, the data Kalman gain vectors and data likelihood variables of a current sample period are determined from previous data Kalman gain vectors and data likelihood variables of a previous sample period using the regularization prediction vectors and regularization prediction error energies of the current sample period and associated with the regularization refresh update covariance matrix $R_{p,n}$. Such regularization prediction vectors and regularization prediction error energies of the current sample period are in turn determined from their predecessors and the regularization Kalman gain vectors as well as regularization likelihood ratios that are determined from their predecessors and the data prediction vectors and prediction error energies of the previous sample period.

For forward linear prediction, the order update identity for $R_{p,n}^{-1}$ is:

$$R_{p,n}^{-1} = \begin{bmatrix} 0 & \vec{0}^T \\ \vec{0} & \overline{R}_{p,n-1}^{-1} \end{bmatrix} + E_{a,p,n}^{-1}\vec{a}_{p,n}\vec{a}_{p,n}^T \tag{23}$$

where $\overline{R}_{p,n}$ is the upper right (N−1)×(N−1) submatrix of $R_{p,n}$, $\vec{a}_{p,n}$ is the optimal forward linear prediction vector for $R_{p,n}$, and $E_{a,p,n}$ is the corresponding forward prediction error energy.

For backward linear prediction, the order update identity for $R_{p,n}^{-1}$ is:

$$R_{p,n}^{-1} = \begin{bmatrix} \overline{R}_{p,n-1}^{-1} & \vec{0} \\ \vec{0}^T & 0 \end{bmatrix} + E_{b,p,n}^{-1}\vec{b}_{p,n}\vec{b}_{p,n}^T \tag{24}$$

where $\overline{R}_{p,n}$ is the upper right (N−1)×(N−1) submatrix of $R_{p,n}$, $\vec{b}_{p,n}$ is the optimal backward linear prediction vector for $R_{p,n}$, and $E_{b,p,n}$ is the corresponding backward prediction error energy.

$R_{p,n}$, $\vec{a}_{p,n}$, $\vec{b}_{p,n}$, $E_{a,p,n}$, and $E_{b,p,n}$ form the well-known relationships:

$$R_{p,n}\vec{a}_{p,n} = E_{a,p,n}\vec{u} \tag{25}$$

and $$R_{p,n}\vec{b}_{p,n} = E_{b,p,n}\vec{u} \tag{26}$$

where $\vec{u}$ and $\vec{v}$ are pinning vectors:

$$\vec{u} = [1,0,0,\ldots,0]^T \tag{27a}$$

$$\vec{v} = [0,0,\ldots,0,1]^T. \tag{27b}$$

By post-multiplying Equations (23)–(24) by $\vec{x}_n$, it may be shown that:

$$\vec{k}_{0,x,n} = \begin{bmatrix} 0 \\ \vec{k}_{0,x,n-1} \end{bmatrix} + E_{a,p,n}^{-1}e_{0,x,n,a}\vec{a}_{p,n} \tag{28}$$

and $$\begin{bmatrix} \vec{k}_{0,x,n} \\ 0 \end{bmatrix} = \vec{k}_{0,x,n} - E_{b,p,n}^{-1}e_{0,x,n,b}\vec{b}_{p,n} \tag{29}$$

where $$\vec{k}_{0,x,n} = \begin{bmatrix} \overline{R}_{p,n}^{-1} & \vec{0} \\ \vec{0}^T & 0 \end{bmatrix}\vec{x}_n \tag{30}$$

and the a priori forward and backward data prediction errors are:

$$e_{0,x,n,a} = \vec{x}_n^T\vec{a}_{p,n} \tag{30a}$$

$$e_{0,x,n,b} = \vec{x}_n^T\vec{b}_{p,n} \tag{30b}$$

The first and last elements of the vectors in Equations (28)–(29) show that:

$$k_{0,x,n,1} = E_{a,p,n}^{-1}e_{0,x,n,a} \tag{31a}$$

$$k_{0,x,n,N} = E_{b,p,n}^{-1}e_{0,x,n,b} \tag{31b}$$

where $k_{0,x,n,1}$ and $k_{0,x,n,N}$ correspond to the first and last elements of $\vec{k}_{0,x,n}$, respectively.

The data likelihood variable update is obtained by pre-multiplying Equations (28)–(29) by $\vec{x}_n$ and by adding 1 to both sides of the resulting equations, and so from Equation (20):

$$\mu_{x,n}^{-1} = \bar{\mu}_{x,n-1}^{-1} + E_{a,p,n}^{-1} e_{0,x,a,n}^2 \quad (32)$$

$$\bar{\mu}_{x,n} = \mu_{x,n}^{-1} - E_{b,p,n}^{-1} e_{0,x,b,n}^2 \quad (33)$$

where $$\bar{\mu}_{x,n} = \left[ 1 + \begin{bmatrix} \vec{k}_{0,x,n} \\ 0 \end{bmatrix}^T \vec{x}_n \right]^{-1} \quad (34)$$

From the order update identity of $R_{x,n}^{-1}$, the following relationships may be derived:

$$\vec{k}_{1,x,n} = \begin{bmatrix} 0 \\ \vec{k}_{1,x,n-1} \end{bmatrix} + E_{a,x,n}^{-1} e_{1,x,n,a} \vec{a}_{x,n} \quad (35)$$

$$\begin{bmatrix} \vec{k}_{1,x,n} \\ 0 \end{bmatrix} = \vec{k}_{1,x,n} - E_{b,x,n}^{-1} e_{1,x,n,b} \vec{b}_{x,n} \quad (36)$$

where $$R_{x,n} \vec{a}_{x,n} = E_{a,x,n} \vec{\mu} \quad (37)$$

$$R_{x,n} \vec{b}_{x,n} = E_{b,x,n} \vec{v}$$

$$\vec{k}_{1,x,n} = \begin{bmatrix} \bar{R}_{x,n}^{-1} & \vec{0} \\ \vec{0}^T & 0 \end{bmatrix} \vec{x}_n$$

and the a priori forward and backward data prediction errors are:

$$e_{1,x,n,a} = \vec{x}_n^T \vec{a}_{x,n} \quad (38a)$$

$$e_{1,x,n,b} = \vec{x}_n^T \vec{b}_{x,n} \quad (38b)$$

The first and last elements of the vectors in Equations (35)–(36) show that:

$$k_{1,x,n,1} = E_{a,x,n}^{-1} e_{1,x,n,a} \quad (39a)$$

$$k_{1,x,n,N} = E_{b,x,n}^{-1} e_{1,x,n,b} \quad (39b)$$

Equation (16) is then post-multiplied by $\vec{a}_{p,n}$ and pre-multiplied by $R_{x,n}^{-1}$, and so, using Equation (25), it may be shown that:

$$\vec{a}_{p,n} = \frac{E_{a,p,n}}{E_{a,x,n}} \vec{a}_{x,n} + \vec{k}_{1,x,n} e_{0,x,a,n} \quad (40)$$

From the first elements of the vectors of Equation (40) and using Equation (24), $$E_{a,x,n}^{-1} = E_{a,p,n}^{-1} - k_{0,x,n,1}^2 \mu_{x,n} \quad (41)$$

By multiplying both side of Equation (41) by $E_{a,p,n}$, and using Equations (21), (31a), (39a), (35) and (40), $$\vec{a}_{x,n} = \vec{a}_{p,n} - [0, \vec{k}_{1,x,n-1}^T]^T e_{0,x,n,a} \quad (42)$$

$$= \vec{a}_{p,n} - [0, \vec{k}_{0,x,n-1}^T \bar{\mu}_{x,n-1} e_{0,x,n,a} \quad (43)$$

$$= \vec{a}_{p,n} - [0, \vec{k}_{0,x,n-1}^T]^T e_{1,x,n,a} \quad (44)$$

which is obtained using the identity:

$$\vec{k}_{1,x,n} = \bar{\mu}_{x,n-1} \vec{k}_{0,x,n}$$

and $$e_{1,x,n,a} = \bar{\mu}_{x,n-1} e_{0,x,n,a} \quad (45)$$

The relations for the data backward predictor error energy, the data backward prediction vector, the a posteriori data backward prediction error, and the a priori data backward prediction error are:

$$E_{b,x,n} = E_{b,p,n} + e_{0,x,n,b} e_{1,x,n,b} \quad (46)$$

$$\vec{b}_{x,n} = \vec{b}_{p,n} + [\vec{k}_{0,x,n}^T, 0]^T e_{1,x,n,b} \quad (47)$$

$$e_{1,x,n,b} = \bar{\mu}_{x,n} e_{0,x,n,b} \quad (48)$$

Using the above Equations, the disclosed adaptive filter 10 and method perform initialization of parameters according to Table 1 below:

TABLE 1

| | |
|---|---|
| $\vec{a}_{x,-1} = \vec{u}$ | $\vec{b}_{x,-1} = \vec{v}$ |
| $E_{b,x,-1} = \delta$ | $E_{a,x,-1} = \lambda^{N-1} E_{b,x,-1}$ |
| $\bar{\mu}_{x,-1} = 1$ | $\bar{\mu}_{p,-1} = 1$ |
| $\vec{k}_{0,p,-1} = \vec{0}$ | $\vec{k}_{0,x,-1} = \vec{0}$ |
| $\vec{x}_{-1} = \vec{0}$ | $\vec{y}_{-1} = \vec{0}$ |
| $\vec{p}_{-1} = \vec{0}$ | |
| $K_1 = 1.5$ | $K_2 = 2.5$ |
| $K_4 = 0$ | $K_5 = 1$ |

Figure 2:
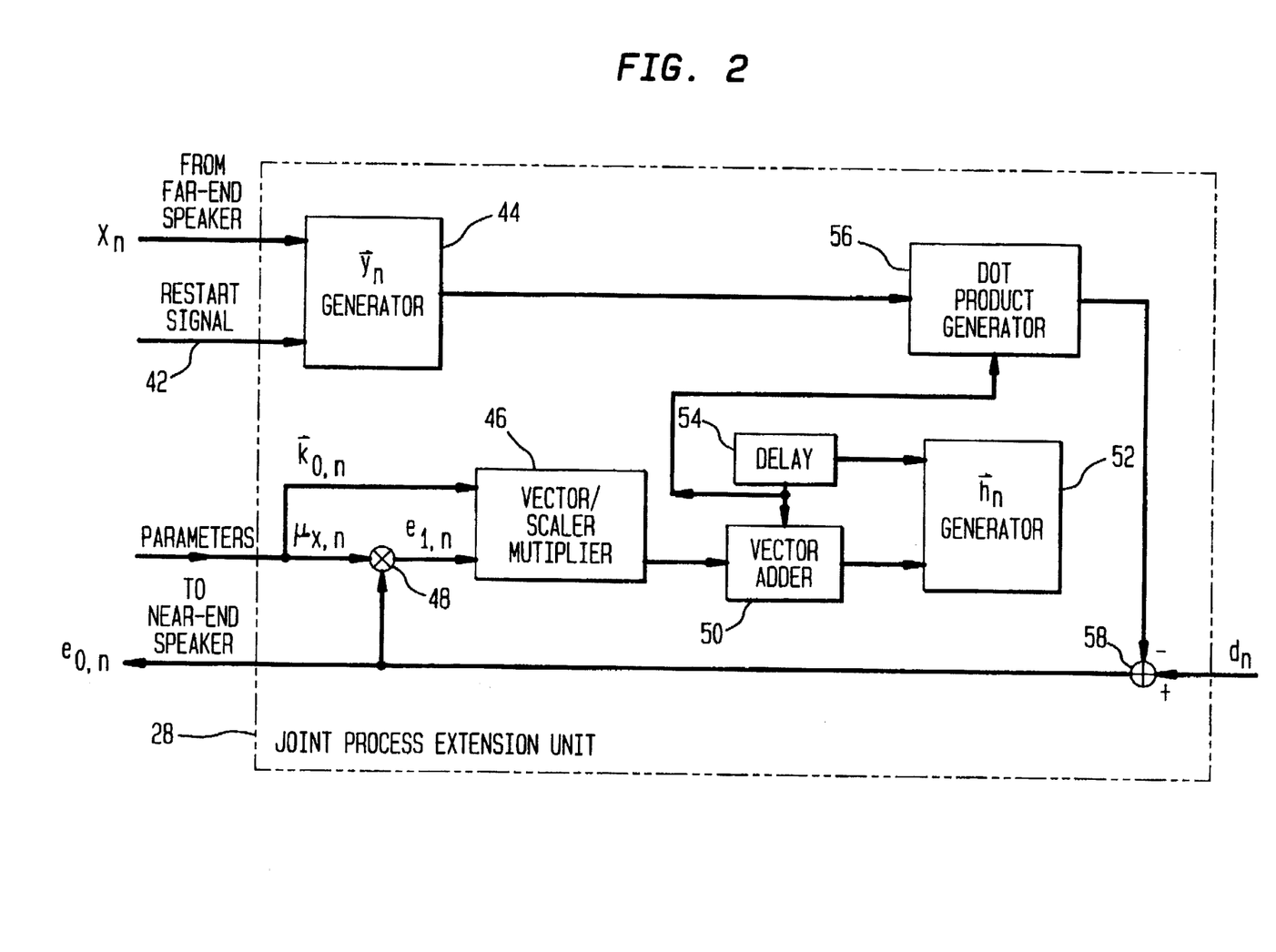
FIG. 2 illustrates a portion of the block diagram of the disclosed adaptive filter of FIG. 1 in greater detail.

The $\vec{y}_n$ data vector is generated by the $\vec{y}_n$ generator of the joint process extension unit shown in FIG. 2. In response to the restart signal 42 indicating NO RESTART status, $\vec{y}_n$ is generated to be a copy of $\vec{x}_n$ obtained from the excitation signal $x_n$.

Initialization may be performed to initiate the adaptive filtering upon start-up of the adaptive filter 10 and method. To re-initialize the disclosed adaptive filter 10 and method during a computational restart or rescue procedure, the initialization of Table 1 is performed, except that the $\vec{y}_n$ data vector is not zeroed out. If the restart signal 42 indicates a restart, the $\vec{y}_n$ generator 44 does not zero out $\vec{y}_n$, although $\vec{x}_n$ is zeroed out.

The disclosed adaptive filter 10 and method, using the various hardware processors and components represented in the block diagrams in FIGS. 1–2, operate to implement the disclosed DR-FRLS adaptive filtering in accordance with the equations of Tables 2–5 below.

The derivation of Table 3 for the data updates may be shown with reference to the equations above, and the derivation of Table 2 for the regularization updates may be derived by one having ordinary skill in the art in an analogous manner to the derivation of Table 3. The updates of Tables 2–3 use error feedback for stabilization, such as described in D. T. M. Slock et al., "Numerically Stable Transversal Filters for Recursive Least Squares Adaptive Filtering," IEEE TRANSACTIONS ON SIGNAL PROCESSING, VOL. 39, NO. 1, January 1991, pp. 92–114.

Referring to FIG. 1, the second parameter generator 24 generates regularization update signals using adders, multipliers, and the like, in a manner known in the art, for example, as described in U.S. Pat. No. 5,371,789 to Hirano, which is incorporated herein by reference. For example, implementation of the steps of Table 2 may include the use of delays for delaying the sample values.

Such regularization update signals correspond to the regularization update parameters of steps (1)–(19) of Table 2. As each of steps (3), (11), (14) and (17) employs about N multiplies, the total computational complexity of steps (1)–(19) is about 4N multiplies.

The first parameter generator 22 shown in FIG. 1 generates data update signals, in a manner known in the art using adders, multipliers, and the like, corresponding to the data update parameters of steps (20)–(38) of Table 3. As each of steps (20), (22), (24), (30), (33), and (36) employs about N multiplies, the total computational complexity of steps (20)–(38) is about 6N multiplies.

TABLE 2

Regularization Related Updates:

1) $e_{0,p,a,a} = \bar{a}_{x,n-1}^T \zeta_n P_n$
2) $k_{0,p,a,1} = E_{a,x,n-1}^{-1} \lambda^{-1} e_{0,p,a,a}$
3) $\bar{k}_{0,p,a} = [0, \bar{k}^T_{0,p,n-1}]^T + \bar{a}_{x,n-1} k_{0,p,a,1}$
4) $\mu_{p,a}^{-1} = \mu_{p,a-1}^{-1} + \psi_n e_{0,p,a,a} k_{0,p,a,1}$
5) $e^f_{0,p,a,b} = \bar{b}_{x,n-1}^T \zeta_n P_n$
6) $k^f_{0,p,a,N} = \lambda^{-1} E_{b,x,n-1}^{-1} e^f_{0,p,a,b}$
7) extract $k^s_{0,p,a,N}$ from $\bar{k}_{0,p,a}$
8) $e^s_{0,p,a,b} = \lambda E_{b,x,n-1} k^s_{0,p,a,N}$
9) $e^{(j)}_{0,p,a,b} = K_j e^f_{0,p,a,b} + (1-K_j)e^s_{0,p,a,b}$   j = 1, 2, 5
10) $k_{0,p,a,N} = K_4 k^f_{0,p,a,N} + (1-K_4) k^s_{0,p,a,N}$
11) $[\bar{k}^T_{0,p,a}, 0]^T = \bar{k}_{0,p,a} - \bar{b}_{x,n-1} k_{0,p,a,N}$
12) $\mu_{p,a}^{-1} = \mu_{p,a}^{-1} - \psi_n e^{(5)}_{0,p,a,b} k^f_{0,p,a,N}$
13) $e_{1,p,a,a} = \mu_{p,a-1} e_{0,p,a,a}$
14) $\bar{a}_{p,a} = \bar{a}_{x,n-1} - \psi_n [0, \bar{k}^T_{0,p,n-1}]^T e_{1,p,a,a}$
15) $E^{-1}_{a,p,n} = \lambda^{-1} E^{-1}_{a,x,n-1} - \psi_n k^2_{0,p,a,1} \mu_{p,a}$
16) $e^{(j)}_{1,p,a,b} = \mu_{p,a} e^{(j)}_{0,p,a,b}$   j = 1, 2
17) $\bar{b}_{p,a} = \bar{b}_{x,n-1} - \psi_n [\bar{k}^T_{0,p,a}, 0]^T e_{1,p,a,b}$
18) $E_{b,p,a} = \lambda E_{b,x,n-1} + \psi_n e_{0,p,a,b} e_{1,p,a,b}$
19) if $\mu_{p,a} > 1$, restart the regularization updates.

TABLE 3

Data Related Updates:

20) $e_{0,x,a,a} = \bar{a}_{p,a}^T \bar{x}_n$
21) $k_{0,x,a,1} = E_{a,p,n}^{-1} e_{0,x,a,a}$
22) $\bar{k}_{0,x,a} = [0, \bar{k}^T_{0,x,n-1}]^T + \bar{a}_{p,a} k_{0,x,a,1}$
23) $\mu_{x,n}^{-1} = \mu_{x,n-1}^{-1} + e_{0,x,a,a} k_{0,x,a,1}$
24) $e^f_{0,x,a,b} = \bar{b}_{p,a}^T \bar{x}_n$
25) $k^f_{0,x,a,N} = E^{-1}_{b,p,n} e^f_{0,x,a,b}$
26) extract $k^s_{0,x,a,N}$ from $\bar{k}_{0,x,a}$
27) $e^s_{0,x,a,b} = E_{b,p,n} k^s_{0,x,a,N}$
28) $e^{(j)}_{0,x,a,b} = k_j e^f_{0,x,a,b} + (1-K_j) e^s_{0,x,a,b}$   j = 1, 2, 5
29) $k_{0,x,a,N} = K_4 e^f_{0,x,a,N} + (1-K_4) k^s_{0,x,a,N}$
30) $[\bar{k}^T_{0,x,a}, 0]^T = \bar{k}_{0,x,a} - \bar{b}_{p,a} k_{0,x,a,N}$
31) $\mu_{x,n}^{-1} = \mu_{x,n}^{-1} - e^{(5)}_{0,x,a,b} k^f_{0,x,a,N}$
32) $e_{1,x,a,a} = \mu_{x,n-1} e_{0,x,a,a}$
33) $\bar{a}_{x,n} = \bar{a}_{p,a} - [0, \bar{k}^T_{0,x,n-1}]^T e_{1,x,a,a}$
34) $E^{-1}_{a,x,n} = E^{-1}_{a,p,n} - k^2_{0,x,a,1} \mu_{x,n}$
35) $e^{(j)}_{1,x,a,b} = \mu_{x,n} e^{(j)}_{0,x,a,b}$   j = 1, 2
36) $\bar{b}_{x,n} = \bar{b}_{p,n} - [\bar{k}^T_{0,x,a}, 0]^T e_{1,x,a,b}$
37) $E_{b,x,n} = E_{b,p,n} + e_{0,x,a,b} e_{1,x,a,b}$
38) if $\mu_{x,n} > 1$, restart the data updates.

The likelihood variable stabilization unit 26 shown in FIG. 1 generates stabilized likelihood variable signals from a forgetting factor signal corresponding to the forgetting factor λ and from regularization update signals and data update signals received from the parameter generators 22, 24, in a manner known in the art using multipliers and the like. The stabilized likelihood variable signals correspond to the parameters $\bar{\mu}_{p,n}$ and $\bar{\mu}_{x,n}$ of steps (30)–(40) of Table 4. The forgetting factor λ may be stored in the memory 18.

The parameter signals representing $\bar{\mu}_{x,n}$ and $\bar{\mu}_{p,n}$ generated by the likelihood variable stabilization unit 26 are output to the parameter generators 22, 24, respectively.

TABLE 4

Likelihood Variable Stabilization:

| 39) | if n is odd: $\bar{\mu}_{p,n} = \lambda^{N-1} (\mu_{p,n} E_{a,x,n}/E_{b,x,n})^{-1}$ |
| 40) | if n is even: $\bar{\mu}_{x,n} = \lambda^{N-1} (\mu_{p,n} E_{a,x,n}/E_{b,x,n})^{-1}$ |

In steps (39)–(40), likelihood variable estimates are stabilized using the multi-channel, multi-experiment method of D.T.M. Slock et al., "A Modular Multichannel Multiexperiment Fast Transversal Filter RLS Algorithm", *Signal Processing*, Elsevier Science Publishers, VOL. 28, 1992, pp. 25–45.

The updated $\bar{\mu}_{x,n}$ is used by the second parameter generator 24 when n is even; otherwise, the previous value of $\bar{\mu}_{x,n}$ stored by the second parameter generator 24 is used for the regularization related updates of steps (1)–(19). The updated $\bar{\mu}_{p,n}$ is used by the first parameter generator 22 when n is odd; otherwise, the previous value of $\vec{\mu}_{x,p}$ stored by the first parameter generator 22 is used for the data related updates of steps (20)–(38).

The joint process extension unit 28 shown in FIGS. 1–2 generates the echo residual signal 40 in a manner known in the art using adders, multipliers, and the like, corresponding to the parameters generated in steps (41)–(43) of Table 5 below.

TABLE 5

Joint Process Extension

| 41) | $e_{0,n} = d_n - \bar{h}_{n-1}^T \vec{y}_n$ |
| 42) | $e_{1,n} = e_{0,n} \mu_{x,n}$ |
| 43) | $\bar{h}_n = \bar{h}_{n-1} + \bar{k}_{0,x,n} e_{1,n}$ |

In an exemplary embodiment shown in FIG. 2, the joint process extension unit 28 may include a $\vec{y}_n$ generator 44 responsive to the excitation signal $x_n$ and the restart signal 42 for generating a data vector signal corresponding to the $\vec{y}_n$ data vector. In the exemplary embodiment, the joint process extension unit 28 may also include a vector/scalar multiplier 46, a multiplier 48, a vector adder 50, an $\vec{h}_n$ generator 52, a sample delay 54, a dot product generator 56, and an adder 58 for implementing steps (41)–(43) of Table 5 above to generate data signals corresponding to the parameters in step (41)–(43).

The $\vec{y}_n$ data vector is generated by the $\vec{y}_n$ generator 44 of the joint process extension unit shown in FIG. 2. In response to the restart signal 42 indicating NO RESTART status, $\vec{y}_n$ is generated to be a copy of $\vec{x}_n$ obtained from the excitation signal $x_n$.

As each of steps (41) and (43) employs about N multiplies, the total computational complexity of steps (41)–(43) is about 2N multiplies. Accordingly, the total computational complexity of steps (1)–(43) is about 12N multiplies, thus providing O(N) computational complexity.

Figure 3:
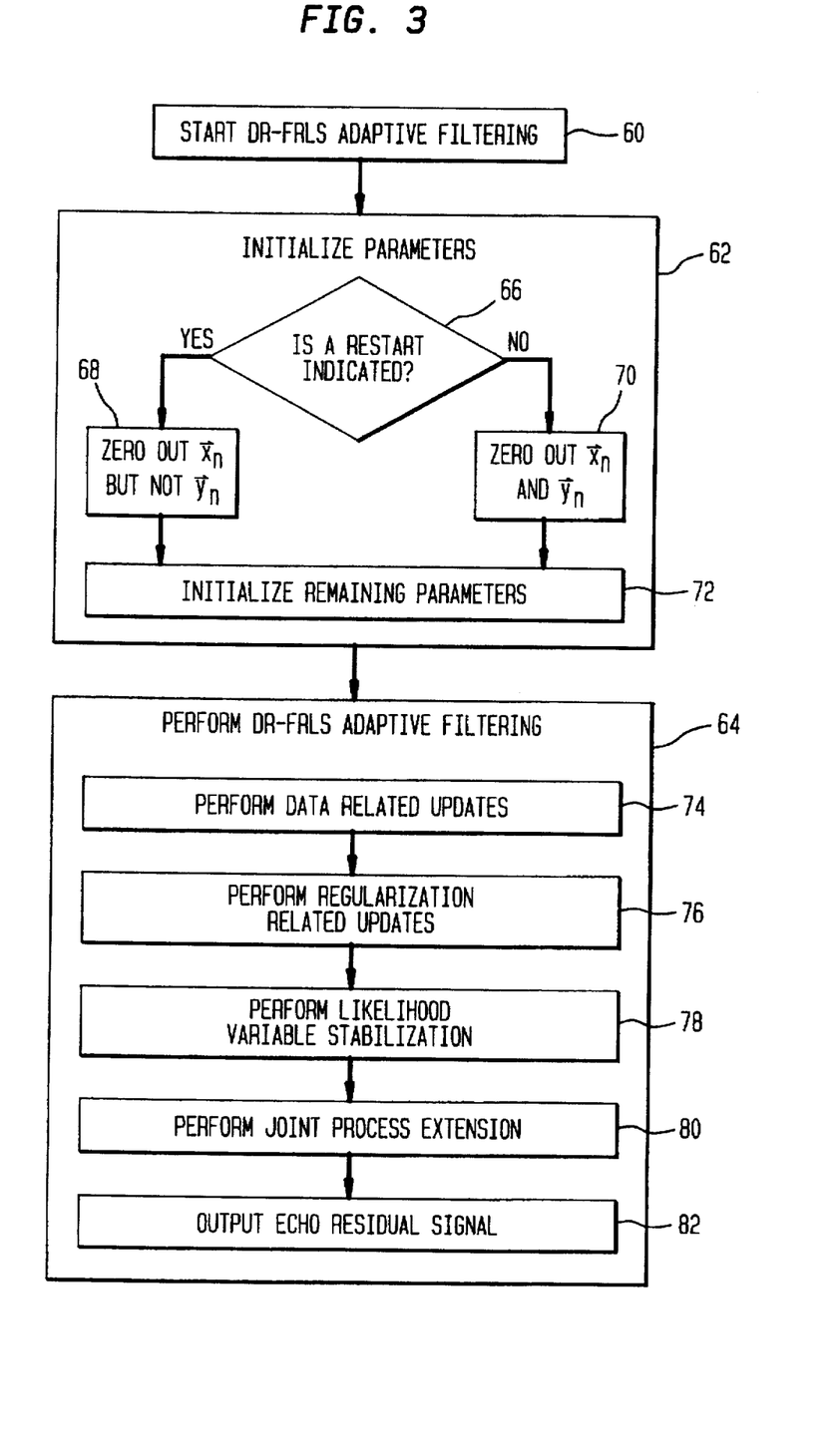
FIG. 3 shows a flowchart of a method of operation of the disclosed adaptive filter.

The disclosed adaptive filter 10 operates according to an exemplary method as shown in FIG. 3, including the steps of starting the DR-FRLS adaptive filtering in step 60, initializing parameters in step and performing the DR-FRLS adaptive filtering in step 64. As described above for FIG. 2, the disclosed adaptive filter 10 and method initializes parameters in step 62 by detecting whether a restart is indicated in step 66 using the restart signal 42; zeroing out $\vec{x}_n$ and not $\vec{y}_n$ in step 68 if a restart is indicated; and zeroing out both $\vec{x}_n$ and $\vec{y}_n$ in step 70 if NO RESTART status is indicated. After either of steps 68, 70, the method then initializes the remaining parameters in step 72 to implement Table 1 above.

The method then performs DR-FRLS adaptive filtering in step 64 by concurrently performing steps 74–82, which include the steps of performing the data related updates in step 74 to implement Table 3 above; performing the regularization related updates in step 76 to implement Table 2 above; performing likelihood variable stabilization in step 78 to implement Table 4 above; performing joint process extension in step 80 to implement Table 5 above; and outputting an echo residual signal $e_{0,n}$ to the far-end speaker in step 82.

While the disclosed adaptive filter 10 and method of operation have been particularly shown and described with reference to the preferred embodiments, it is understood by those skilled in the art that various modifications in form and detail may be made therein without departing from the scope and spirit of the invention. For example, although the disclosed adaptive filter and method have been described in an exemplary embodiment for an echo cancellation application, the application of the disclosed adaptive filter and method to speech processing and video processing, including video compression, may also be implemented. Accordingly, modifications such as those suggested above, but not limited thereto, are to be considered within the scope of the invention.

What is claimed is:

1. An adaptive filter comprising:
    a memory for storing at least one program, including a dynamically regularized fast recursive least squares (DR-FRLS) program; and
    a processor, responsive to the DR-FRLS program, for dynamically generating regularization signals from the input signal for adaptively filtering an input signal and for generating an output signal associated with the adaptively filtered input signal from the regularization signals.

2. The adaptive filter of claim 1 wherein the processor is responsive to a dynamically adjustable forgetting factor signal corresponding to a forgetting factor λ for dynamically controlling the adaptive filtering of the input signal.

3. The adaptive filter of claim 1 wherein the processor further includes:
    a first parameter generator for generating data related update signals from the input signal; and
    a second parameter generator for generating regularization related update signals from a refresh signal as the regularization signals;
    wherein the processor uses the data related update signals and the regularization related update signals to generate the output signal.

4. The adaptive filter of claim 3 wherein the likelihood variable stabilization unit is responsive to a forgetting factor signal corresponding to a forgetting factor λ for controlling the stabilizing of the likelihood variable estimates.

5. The adaptive filter of claim 4 wherein the likelihood variable stabilization unit is responsive to the forgetting factor signal being dynamically adjustable for dynamically controlling the stabilizing of the likelihood variable estimates during the adaptive filtering process.

6. The adaptive filter of claim 1 wherein the processor further includes:
    a likelihood variable stabilization unit for stabilizing likelihood variable estimates associated with the input signal; and
    a joint process extension processing unit responsive to the stabilized likelihood variable estimates for generating the output signal.

7. An echo cancellation system to compensate for an echo in an environment, the echo being associated with an excitation signal, the echo cancellation system comprising:
    an adaptive filter for dynamically generating regularization signals for adaptively filtering the excitation signal using a dynamically regularized fast recursive least squares (DR-FRLS) technique and a dynamically adjusted forgetting factor signal to generate an echo residual signal associated with the excitation signal, the echo residual signal for compensating for the echo in the environment.

8. The echo cancellation system of claim 7 wherein the adaptive filter further includes:
    a first parameter generator for generating data related update signals from the excitation signal; and
    a second parameter generator for generating regularization related update signals from a refresh signal as the regularization signals;
    wherein the adaptive filter uses the data related update signals and the regularization related update signals to generate the echo residual signal.

9. The echo cancellation system of claim 7 wherein the adaptive filter further includes:
    a likelihood variable stabilization unit for dynamically stabilizing likelihood variable estimates using the dynamically adjusted forgetting factor signal, the likelihood variable estimates associated with the excitation signal; and
    a joint process extension processing unit responsive to the dynamically stabilized likelihood variable estimates for generating the echo residual signal.

10. A method for adaptively filtering an input signal using an adaptive filter comprising the steps of:
    (a) operating a processor using a dynamically regularized fast recursive least squares (DR-FRLS) program;
    (b) processing the input signal by adaptive filtering using the processor operated by the DR-FRLS program to dynamically generate regularization signals; and
    (c) generating an output signal associated with the adaptively filtered input signal from the regularization signals.

11. The method of claim 10 wherein the step (b) of processing the input signal includes the steps of:
    (b1) receiving a forgetting factor signal corresponding to a forgetting factor; and
    (b2) controlling the adaptive filtering of the input signal using the forgetting factor signal.

12. The method of claim 11 further including the steps of:
    (a1) dynamically adjusting the forgetting factor signal;
    the step (b1) of receiving the forgetting factor signal includes the step of receiving the dynamically adjusted forgetting factor signal; and
    the step (b2) of controlling the adaptive filtering of the input signal includes dynamically controlling the adaptive filtering using the dynamically adjusted forgetting factor signal.

13. The method of claim 10 wherein the step (b) of processing the input signal includes concurrently performing the steps of:
   (b1) performing data related updating using the input signal; and
   (b2) performing regularization related updating using a refresh signal to generate the regularization signals.

14. The method of claim 10 wherein the step (b) of processing the input signal includes concurrently performing the steps of:
   (b1) performing likelihood variable stabilization for stabilizing likelihood variable estimates associated with the input signal; and
   (b2) performing joint process extension processing on the stabilized likelihood variable estimates for generating the output signal.

15. A method for performing echo cancellation to compensate for an echo in an environment, the echo being associated with an excitation signal, the method comprising the steps of:
   (a) receiving the excitation signal;
   (b) operating an adaptive filter using a dynamically regularized fast recursive least squares (DR-FRLS) technique;
   (c) adaptively filtering the excitation signal using the DR-FRLS technique;
   (d) generating an echo residual signal associated with the adaptively filtered excitation signal; and
   (e) compensating for the echo using the echo residual signal.

16. The method of claim 15 wherein the step (c) of adaptively filtering the excitation signal includes the steps of:
   (c1) receiving a forgetting factor signal corresponding to a forgetting factor; and
   (c2) controlling the adaptive filtering of the excitation signal using the forgetting factor signal.

17. The method of claim 16 further including the steps of:
   (b1) dynamically adjusting the forgetting factor signal;
   the step (c1) of receiving the forgetting factor signal includes the step of receiving the dynamically adjusted forgetting factor signal; and
   the step (c2) of controlling the adaptive filtering of the excitation signal includes dynamically controlling the adaptive filtering using the dynamically adjusted forgetting factor signal.

* * * * *